(12) United States Patent
Kim (10) Patent No.: US 8,956,749 B2
(45) Date of Patent: Feb. 17, 2015

(54) BATTERY PACK

(75) Inventor: Bongyoung Kim, Yongin-si (KR)

(73) Assignee: Samsung SDI Co., Ltd., Suwon-si, Gyeonggi-do (KR)

( * ) Notice: Subject to any disclaimer, the term of this patent is extended or adjusted under 35 U.S.C. 154(b) by 821 days.

(21) Appl. No.: 12/382,856

(22) Filed: Mar. 25, 2009

(65) Prior Publication Data

US 2009/0280401 A1     Nov. 12, 2009

(30) Foreign Application Priority Data

May 9, 2008 (KR) .................. 10-2008-0043371

(51) Int. Cl.
- *H01M 2/10* (2006.01)
- *H01M 2/34* (2006.01)
- *H01M 2/04* (2006.01)
- *H01M 2/08* (2006.01)
- *H01M 10/42* (2006.01)

(52) U.S. Cl.
CPC ............. *H01M 2/34* (2013.01); *H01M 2/0404* (2013.01); *H01M 2/08* (2013.01); *H01M 2/348* (2013.01); *H01M 10/4257* (2013.01); *H01M 2200/106* (2013.01)
USPC .......................................................... 429/96

(58) Field of Classification Search
USPC .......................................................... 429/96
See application file for complete search history.

(56) References Cited

U.S. PATENT DOCUMENTS

| | | | |
|---|---|---|---|
| 7,592,778 B2 | 9/2009 | Ooshita et al. | |
| 2005/0053827 A1 | 3/2005 | Watanabe et al. | |
| 2005/0214597 A1 | 9/2005 | Kim et al. | |
| 2006/0105238 A1* | 5/2006 | Woo | 429/180 |
| 2007/0158830 A1 | 7/2007 | Miyamoto et al. | |
| 2008/0017408 A1* | 1/2008 | Morishita et al. | 174/260 |

FOREIGN PATENT DOCUMENTS

| | | |
|---|---|---|
| CN | 1976024 A | 6/2007 |
| CN | 101047312 A | 10/2007 |
| EP | 1 717 882 A1 | 11/2006 |
| EP | 1 804 314 A2 | 7/2007 |
| EP | 1 995 804 A1 | 11/2008 |
| JP | 2002-279949 A | 9/2002 |
| JP | 2004-006524 A | 1/2004 |
| JP | 2004-127617 * | 4/2004 |
| JP | 2005-276525 A | 10/2005 |
| JP | 2007-274866 A | 10/2007 |
| JP | 2008-027624 * | 2/2008 |
| JP | 2007-095711 * | 9/2013 |

(Continued)

OTHER PUBLICATIONS

Chinese First Office Action in CN 200910131256.5, dated Apr. 7, 2011 (KIM).

(Continued)

*Primary Examiner* — Ula C. Ruddock
*Assistant Examiner* — Jacob Marks
(74) *Attorney, Agent, or Firm* — Lee & Morse, P.C.

(57) ABSTRACT

A battery pack, including a cell, a circuit module electrically coupled to the cell, the circuit module including, an insulation substrate, an electrical element on the insulation substrate, and at least one resin layer surrounding the electrical element, and a cover surrounding the circuit module and coupling the circuit module to the cell.

16 Claims, 7 Drawing Sheets

(56) References Cited

FOREIGN PATENT DOCUMENTS

KR 10-2006-0086804 A 8/2006
KR 10 2007-0098458 A 10/2007

OTHER PUBLICATIONS

Office Action issued in corresponding Japanese application, 2009-063064, dated Jun. 5, 2012.

* cited by examiner

BATTERY PACK

BACKGROUND

1. Technical Field

Embodiments relate to a battery pack.

2. Description of the Related Art

A battery pack may be formed by electrically coupling a cell to a protection circuit module (PCM). The cell may be formed by sealing a can containing an electrode assembly and electrolyte. The cell may be charged or discharged through chemical reaction. The protection circuit module may include a printed circuit board (PCB) having electrical components, e.g., an integrated circuit, a charging/discharging switch, and a passive element. The printed circuit board may protect the cell from overcharge, over-discharge, and over-current, and may prevent performance degradation of the battery pack. In a battery pack, the cell may be spaced at a predetermined distance from the protection circuit module in order to prevent a short between the cell and protection circuit module. When the cell is spaced from the protection circuit module as described above, volume and capacity occupied by the cell in the battery pack may be reduced. Accordingly, space utilization of the battery pack may be reduced.

On the other hand, in a horizontal installation type battery pack, the protection circuit module may be disposed at a side of the cell. An additional fixing member may be used to stably seat and fix the protection circuit module. Accordingly, the manufacturing process may become complicated, and manufacturing cost may increase because of the fixing member.

In a vertical installation type battery pack, an insulating dummy tab having the same height as a lead tab may be used to separate the cell from the protection circuit module, and to maintain balance, i.e., to maintain the horizontal disposition of the protective circuit module relative to the cell. Accordingly, the manufacturing process may become complicated and manufacturing cost may increase because of the dummy tab.

SUMMARY

Embodiments are therefore directed to a battery pack, which substantially overcome one or more of the problems due to the limitations and disadvantages of the related art.

It is therefore a feature of an embodiment to provide a battery pack that is manufactured by a simplified process with reduced manufacturing costs.

It is therefore another feature of an embodiment to provide a battery pack with improved space utilization.

At least one of the above and other features and advantages may be realized by providing a battery pack including a cell, a circuit module electrically coupled to the cell, the circuit module including an insulation substrate, an electrical element on the insulation substrate, and at least one resin layer surrounding the electrical element, and a cover surrounding the circuit module and coupling the circuit module to the cell.

The cell may have a long side edge and the resin layer may overlie the long side edge of the cell.

The resin layer may include a groove part having a shape corresponding to the long side edge of the cell and a side wall part extending from the groove part towards the insulation substrate.

The resin layer may include a heat discharge hole in the groove part.

At least one of i) an active element including at least one of a charge switching element, a discharge switching element, and a control circuit, ii) a thermistor, and iii) a PTC element may be in communication with the heat discharge hole.

The resin layer may include a heat discharge groove extending inwardly from the side wall part.

The side wall part may cover the electrical element.

The cell may have a short side edge and the resin layer may overlie the short side edge of the cell.

The resin layer may include a horizontal part in contact with the short side edge of the cell, and a side wall part extending from the horizontal part towards the insulation substrate.

The resin layer may include an epoxy or epoxy-containing synthetic resin.

The resin layer may be a molding of the epoxy or epoxy-containing synthetic resin.

The resin layer of the circuit module may be disposed between the cell and circuit module.

The battery pack may further include a lead tab electrically coupling the cell and the circuit module.

The lead tab may be the same height as the resin layer.

The circuit module may include a printed circuit pattern on a first surface of the insulation substrate, a conduction pad electrically coupled to the printed circuit pattern, and a charge/discharge terminal on a second surface of the insulation substrate, electrically coupled to the printed circuit pattern.

The charge/discharge terminal may include a cathode terminal, an anode terminal, and an auxiliary terminal between the cathode and anode terminals.

The electrical element may be a chip on board (COB) electrical element.

BRIEF DESCRIPTION OF THE DRAWINGS

The above and other features and advantages will become more apparent to those of ordinary skill in the art by describing in detail exemplary embodiments thereof with reference to the attached drawings, in which:

FIG. 1b illustrates a perspective view of a partially assembled state of the battery pack of FIG. 1a;

FIG. 1c illustrates a perspective view of an assembled state of the battery pack of FIG. 1a;

FIG. 2d illustrates a partial sectional view taken along 'B-B' line of FIG. 2a;

DETAILED DESCRIPTION

Korean Patent Application No. 10-2008-0043371, filed on May 9, 2008, in the Korean Intellectual Property Office, and entitled: "Battery Pack," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

As used herein, the expressions "at least one," "one or more," and "and/or" are open-ended expressions that are both conjunctive and disjunctive in operation. For example, each of the expressions "at least one of A, B, and C," "at least one of A, B, or C," "one or more of A, B, and C," "one or more of A, B, or C" and "A, B, and/or C" includes the following meanings: A alone; B alone; C alone; both A and B together; both A and C together; both B and C together; and all three of A, B, and C together. Further, these expressions are open-ended, unless expressly designated to the contrary by their combination with the term "consisting of." For example, the expression "at least one of A, B, and C" may also include an $n^{th}$ member, where n is greater than 3, whereas the expression "at least one selected from the group consisting of A, B, and C" does not.

As used herein, the expression "or" is not an "exclusive or" unless it is used in conjunction with the term "either." For example, the expression "A, B, or C" includes A alone; B alone; C alone; both A and B together; both A and C together; both B and C together; and all three of A, B, and C together, whereas the expression "either A, B, or C" means one of A alone, B alone, and C alone, and does not mean any of both A and B together; both A and C together; both B and C together; and all three of A, B, and C together.

As used herein, the terms "a" and "an" are open terms that may be used in conjunction with singular items or with plural items. For example, the term "a conductive metal" may represent a single compound, e.g., aluminum, or multiple compounds in combination, e.g., aluminum alloys.

Referring to FIGS. 1a to 1d and FIGS. 2a to 2d, a battery pack 100 according to an embodiment may include a cell 110, a circuit module 120, and a cover case 130. The circuit module 120 may be a protection circuit module. In addition, the battery pack 100 may further include a label 140. In the battery pack 100, an electrical element 122 (FIG. 2d) may be installed on the circuit module 120. The electrical element may be installed as, e.g., a COB (chip on board). A resin layer 125 may be disposed on the surface of the circuit module 120 including the electrical element 122. The resin layer 125 may be thick enough to contact the cell 110. Thus, according to an embodiment, the manufacturing process and structure of the battery pack 100 may be simplified. Therefore, a desirable slim and compact battery pack 100 may be provided.

Figure 1A:
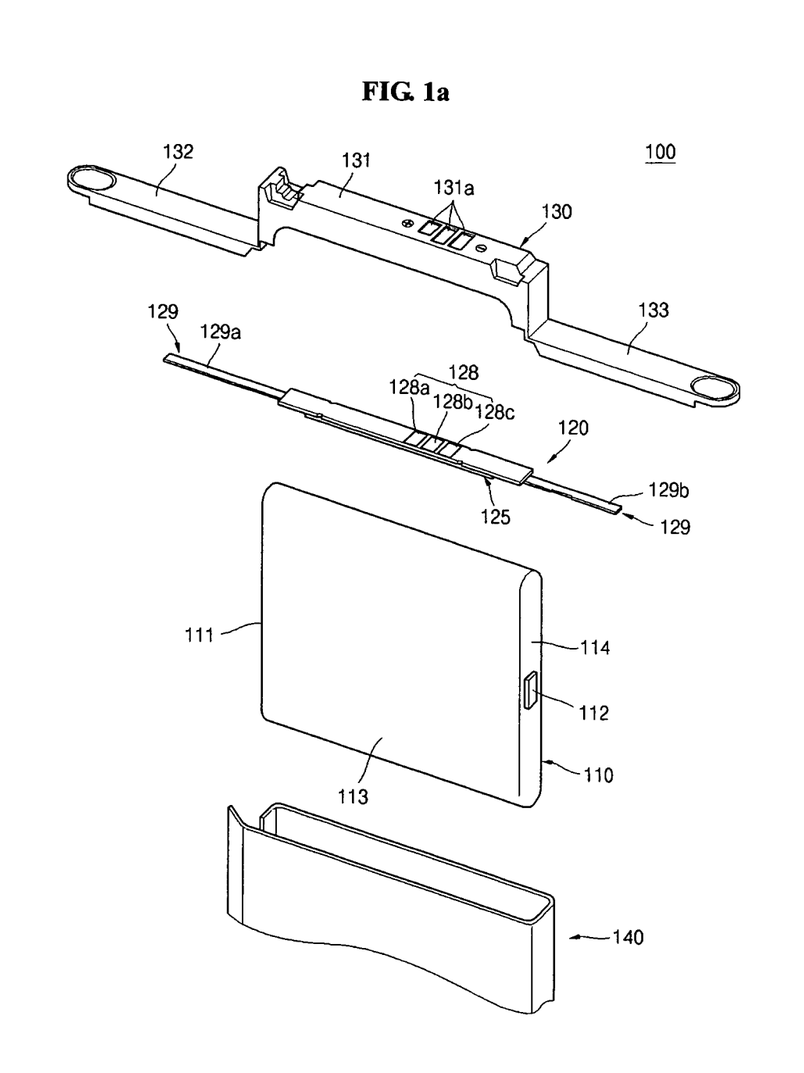
FIG. 1a illustrates an exploded perspective view of a battery pack according to an embodiment.

In an embodiment, the cell 110 may be a can type battery including a cathode 111 and an anode 112. The cell 110 may be formed by providing an electrode assembly (not shown) and electrolyte in an open metal can, and sealing the can with, e.g., a cap assembly 114. A cathode 111 of the electrode assembly (not shown) may be electrically coupled to the can 113. In addition, an anode 112 of the electrode assembly (not shown) may be insulated from the cap assembly 114.

The electrode assembly (not shown) may include cathode and anode plates, and a separator interposed between the two plates. To improve electrical capacity, the electrode assembly may be formed in a jelly-roll shape by interposing the separator between the cathode and anode plates to insulate them from each other, and winding them together.

In a rectangular rechargeable battery, the can 113 may be made of roughly rectangular parallelepiped-shaped metal through a processing method, e.g., deep drawing. The can 113 may be formed of lightweight conductive metal, e.g., aluminum (Al) or aluminum (Al) alloy. The can 113 itself may function as a terminal. The can 113 may contain the electrode assembly and electrolyte. The opening for injecting the electrolyte may be sealed by the cap assembly 114.

As described above, the cap assembly 114 may seal the opening of the can 113 including the electrode assembly. The cap assembly 114 may include an insulation gasket (not shown) to insulate a metallic cap plate (not shown) and the anode 112 of the electrode assembly from the cap plate (not shown). In addition, the cap assembly 114 may further include an insulation plate (not shown) under the cap plate (not shown), a terminal plate under the insulation plate, and an insulation case (not shown) under the terminal plate (not shown).

The circuit module 120 may include an insulation substrate 121, an electrical element 122, and a resin layer 125. In addition, the circuit module 120 may further include a metal pattern 126, a conduction pad 127, and a charge/discharge terminal 128. The circuit module 120 may further include a lead tab 129 connected to both ends thereof.

The circuit module 120 may be electrically coupled to the cell 110. A positive electrode (+) of the circuit module 120 may be electrically coupled to the cathode 111 of the cell 110 by a first lead tab 129a, and a negative electrode (−) of the circuit module 120 may be electrically coupled to the anode 112 of the cell 110 by a second lead tab 129b. The cathode 111 and anode 112 of the cell 110 may have opposite polarities from each other.

Figure 2A:
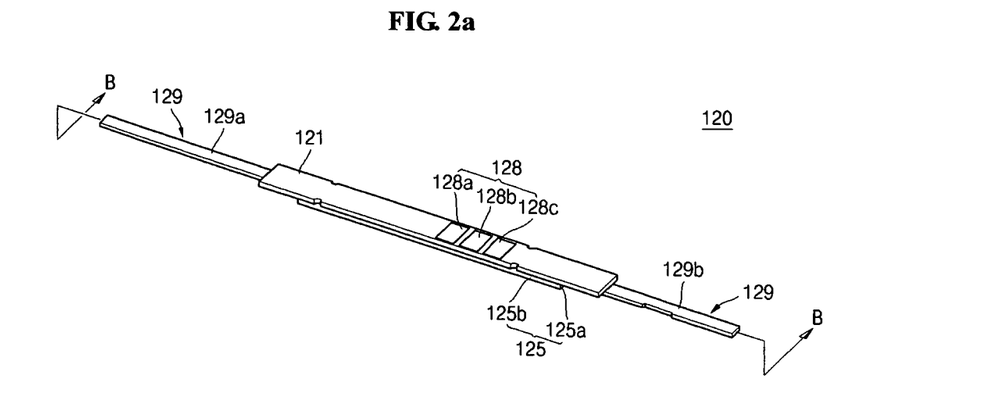
FIGS. 2a to 2c illustrate perspective plan, back, and side views of a protection circuit module according to an embodiment.
Figure 2B:
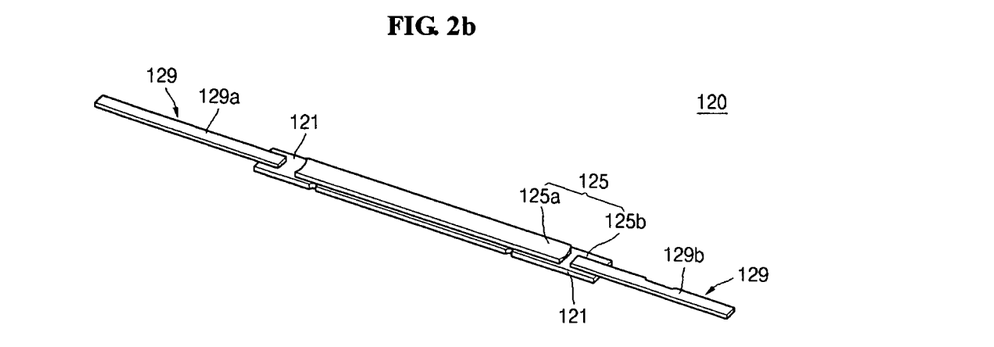
Figure 2C:
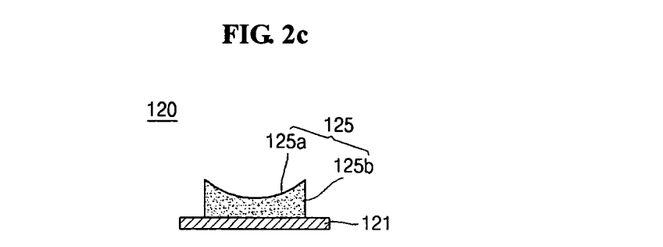
Figure 2D:
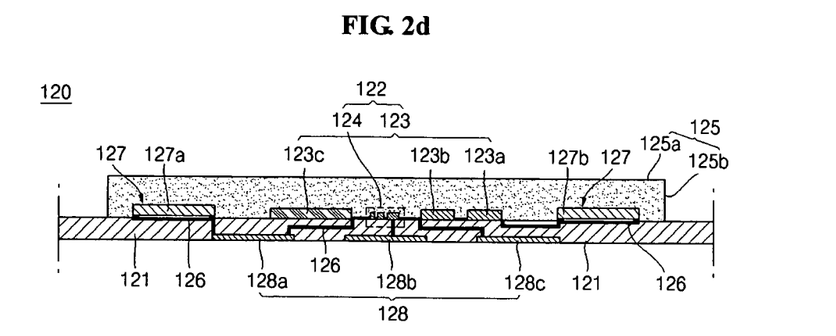

The insulation substrate 121 may include polymer resin, e.g., bakelite or epoxy. A plurality of conductive metal patterns 126 may be printed on the insulation substrate 121. A plurality of electrical elements 122 may be electrically coupled to the plurality of conductive metal patterns 126 to control the cell 110.

The electrical element 122 may include an active element 123 and a passive element 124. In addition, the electrical element 122 may further include a control circuit 123c. The electrical element 122 may be installed on the insulation substrate 121 as, e.g., a COB. A COB electrical element 122 may be directly installed on the insulation substrate 121 printed with the metal pattern 126, without installing an additional conductive lead frame for electrical coupling. When the COB electrical element 122 is installed on the insulation substrate 121 printed with the metal pattern 126, the total thickness of the circuit module 120 may be advantageously reduced, miniaturizing the device to a very compact structure. Thus, a desirably compact and slim battery pack 100 may be manufactured.

The active element 123 may include a charge switching element 123a and a discharge switching element 123b having switching function, e.g., a field effect transistor. When the cell 110 is charged, the charge switching element 123a may be turned on to allow the cell 110 to be charged, and the discharge switching element 123b may be turned off. On the other hand, when the cell 110 is discharged, the discharge switching element 123b may be turned on to allow the cell 110 to be discharged, and the charge switching element 123a may be turned off. The control circuit 123c may be an integrated semiconductor device. The control circuit 123c may be electrically coupled to the charge switching element 123a and discharge switching element 123b to control the switching function thereof.

The passive element 124 may include an electrical element 122, e.g., a resistor, a capacitor, and/or an inductor. The passive element 124 may be electrically coupled to the metal pattern 126. The passive element 124 may be electrically coupled to the active element 123 and may allow the active element 123 to operate normally by setting voltage and current applied to the active element 123.

The circuit module 120 may further include a safety device, e.g., a thermistor or a positive temperature coefficient ("PTC") device (not shown), to protect against, e.g., explosion or firing. Resistance of the thermistor may vary with a temperature change when an internal temperature of the cell 110 is increased. The PTC device may interrupt current when the temperature is increased over a critical value. It may be desirable that the safety device is outside the resin layer 125 covering the electrical element 122 so that the safety device may effectively react to the temperature.

The resin layer 125 may be on a first surface of the circuit module 120 is having the electrical element 122, and thick enough to surround the electrical element 122. The resin layer 125 may be thick enough to be pressed to the cell 110. The resin layer 125 may be formed of, e.g., epoxy or epoxy-containing synthetic resin. In addition, the resin layer 125 may be a molded article, formed by, e.g., molding the epoxy or epoxy-containing synthetic resin. In addition, by using the resin layer 125 according to an embodiment, it may be possible to omit a case holder installation process that may be performed to seat and fix the circuit module 120 in a conventional horizontal installation type battery pack. Thus, the manufacturing process and structure of the battery pack 100 may be simplified. In addition, the resin layer 125 may more stably seat and fix the circuit module 120 to the cell 110 structurally. The resin layer 125 may include a groove part 125a and a side wall part 125b.

Figure 1B:
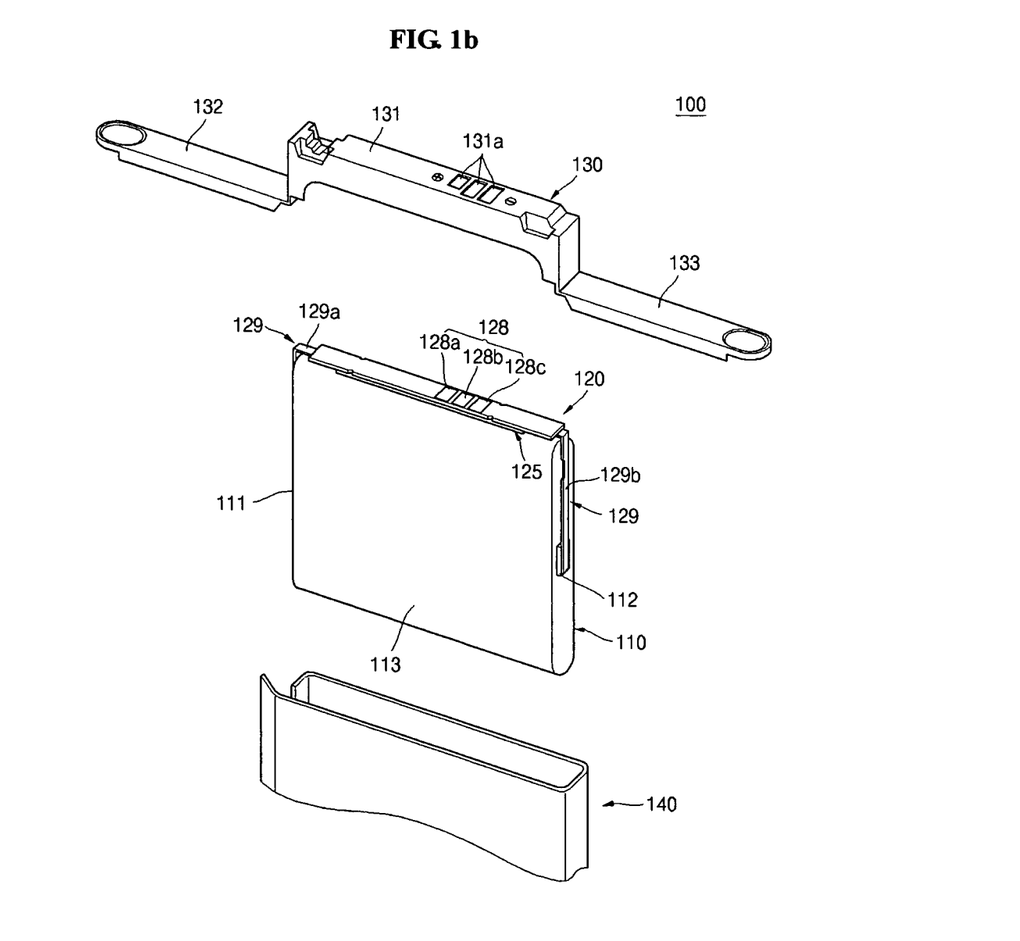
Figure 1C:
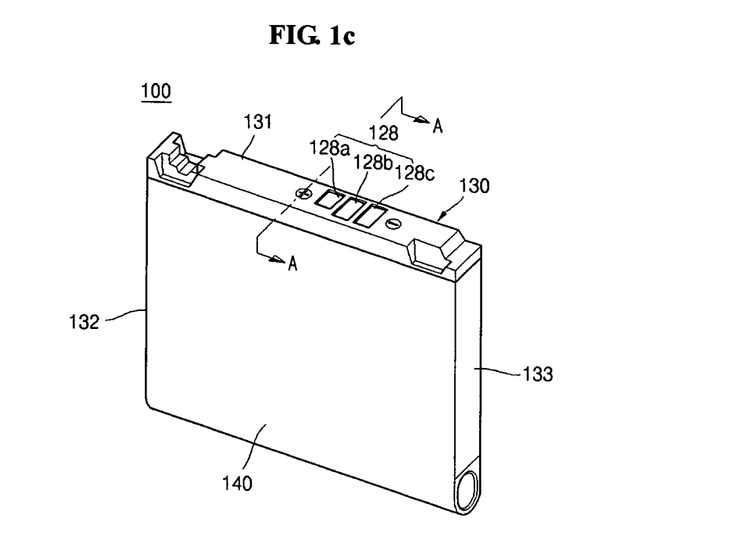
Figure 1D:
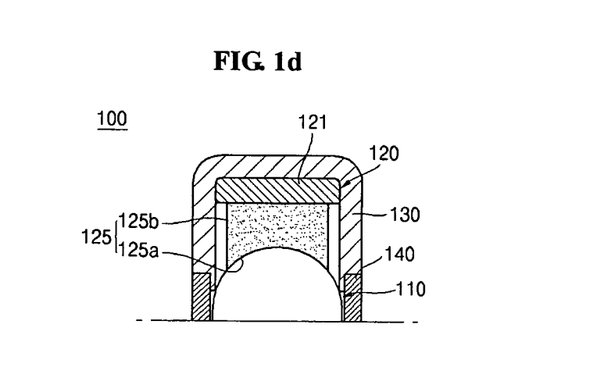
FIG. 1d illustrates a partial sectional view taken along 'A-A' line of FIG. 1c.

The groove part 125a may be disposed adjacent to a long side edge of the cell 110. As shown in the drawing, the long side edge of the cell 110 may correspond to the side surface of the can 113. The long side edge of the cell 110 may have a convex shape corresponding to the shape of the electrode assembly, so as to contact all surfaces of the electrode assembly. This may prevent internal resistance from being increased by movement of the electrode assembly when external impact is applied. It may be desirable that the groove part 125a is tightly pressed against the can 113 to stabilize coupling between the cell 110 and circuit module 120 structurally. Therefore, the groove part 125a may be have a shape corresponding to the convex surface of the can 113. It may be desirable that the groove part 125a have a concave round portion that may contact the convex surface of the can 113.

The side wall part 125b may extend from the groove part 125a. The side wall part 125b may be thick enough to cover the electrical element 122, and to prevent a short between the cell 110 and circuit module 120. It may be desirable that the side wall part 125b extend perpendicularly from the groove part 125a.

The metal pattern 126 may be formed by printing conductive metal, e.g., copper, on the insulation substrate 121 in a wire shape. The metal pattern 126 may be formed on upper and lower surfaces of the insulation substrate 121, a via hole passing through the upper and lower surfaces, and the inside of the insulation substrate 121. However, according to an embodiment, a process for forming the metal pattern 126 inside the insulation substrate 121 may be omitted by installing the electrical element 122 as a COB. Accordingly, the manufacturing process of the battery pack 100 may be simplified and thus the manufacturing cost can be also reduced.

The conduction pad 127 may include first and second conduction pads 127a and 127b. The first conduction pad 127a may be electrically coupled to the cathode 111 of the cell 110 and a cathode terminal 128a of the charge/discharge terminal 128. The second conduction pad 127b may be electrically coupled to the anode 112 of the cell 110, charge switching element 123a, and discharge switching element 123b. The conduction pad 127 may be thicker than the metal pattern 126 in order to be, e.g., welded or soldered, to other metal member. In addition, the conduction pad 127 may include, e.g., nickel or nickel-containing alloy, to improve conductivity.

The charge/discharge terminal 128 may be on a second surface of the insulation substrate 121 opposite to where the electrical element 122 and conduction pad 127 are provided. In addition, the charge/discharge terminal 128 may be electrically coupled to the metal pattern 126. The charge/discharge terminal 128 may include the cathode terminal 128a, anode terminal 128b, and auxiliary terminal 128c. The charge/discharge terminal 128 may function as a path to couple the cell 110 to an outside source.

The lead tab 129 may include first and second lead tabs 129a and 129b. The middle portion of the first lead tab 129a may be bent to be electrically coupled to the cathode 111 of the cell 110. The middle portion of the second lead tab 129b may be bent to be electrically coupled to the anode 112 of the cell 110.

The cover 130 may include an upper case 131 and first and second side covers 132 and 133. In addition, the cover 130 may further include a charge/discharge terminal hole 131a to expose the charge/discharge terminal 128 to the outside. The cover case 130 may be a plastic case manufactured by, e.g., injection molding, of resin, e.g. polycarbonate. The cover 130 may press the cell 110 and circuit module 120 to each other, and protect the circuit module 120 from external impact. The cover 130 may also prevent a short circuit between the cell 110 and circuit module 120.

The upper case 131 may surround the circuit module 120 at the upper part thereof. In addition, the upper case 131 may expose the charge/discharge terminal 128 on the circuit module 120 through the charge/discharge terminal hole 131a at one side thereof.

The first and second side covers 132 and 133 may respectively extend from both ends of the upper case 131 and cover the upper surface of the cell 110 where the first and second lead tabs 129a and 129b are provided. The first and second side covers 132 and 133 may prevent the first and second lead tabs 129a and 129b from being short circuited by contact to an external conductor (not shown).

The label 140 may surround the cell 110 and cover 130. The label 140 may be bonded to the cell 110 and cover 130 by, e.g., an adhesive. An outer surface of the label 140 may be printed with information, e.g., a capacity and a product number of the battery pack 100.

As described above, the electrical element 122 may be installed as a COB in the protection circuit module 120 of the battery pack 100 according to an embodiment. According to an embodiment, the electrical element 122 may be installed in high density. Therefore, a compact and slim battery pack 100 of the high space utilization may be manufactured. In addition, the battery pack 100 may include the resin layer 125 on one surface of the circuit module 120. Thus, according to an embodiment, it may be possible to simplify the manufacturing process and structure of the battery pack by omitting the fixing member, e.g., the case holder, used in a conventional battery pack. Thus, the manufacturing cost may be reduced.

The battery pack according to an embodiment may be the same as the battery pack described above, except that a heat discharge hole may be formed on an upper surface of a resin layer. Accordingly, the same drawing reference numerals are used for the same elements across various figures and explanation about the same elements will be omitted. The resin layer different from the above embodiment will be mainly explained below.

As indicated, the battery pack may include a battery pack 100, a circuit module 120, and a cover 130. In addition, the battery pack 100 may further include a label 140. The battery pack 100 may include a COB electrical element 122 in the circuit module 120. The battery pack 100 may also include a resin layer 225 (FIG. 3) on one surface of the circuit module 120 thick enough to contact the cell 110.

Figure 3:
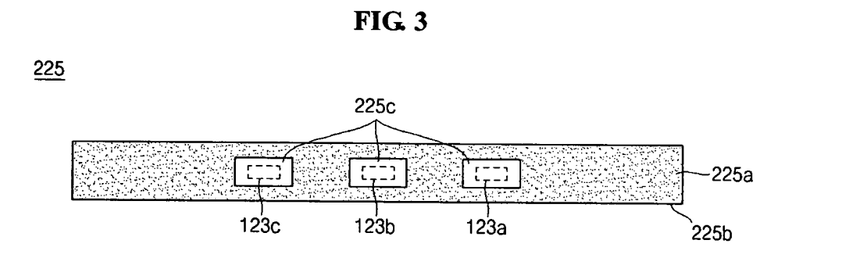
FIG. 3 illustrates a plan view of a shape of a resin layer according to an embodiment.

The resin layer 225 may contact a long side edge of the cell 110. Accordingly, the resin layer 225 may include a groove part 225a contacting the cell 110, and a side wall part 225b extended from the groove part 225a. The groove part 225a may be concave and round, and the side wall part 225b may cover the electrical element 122. The sidewall part 225b may be thick enough to prevent a short between the cell 110 and circuit module 120.

Referring to FIG. 3, a plurality of heat discharge holes 225c may be formed on the groove part 225a. The electrical element 122 inside the resin layer 225 may be exposed to the outside of the resin layer 225 through the heat discharge hole 225c. When the electrical element 122 is driven to charge/discharge the cell 110, much heat may be generated in the electrical element 122. When the electrical element 122 is covered by the resin layer 225, there may be a danger that temperatures of the electrical elements 122, e.g., the charge switching element 123a, discharge switching element 123b, and control circuit 123c may excessively increase. To prevent the danger, the heat discharge hole 225c may keep a proper temperature of the electrical element 122 by discharging the heat generated in the electrical element 122 to the outside of the resin layer 225. Accordingly, the battery pack 100 may be more stably driven. Of course, when a safety device, e.g., a thermistor or PTC element, is inside the resin layer 225, the heat discharge hole 225c should be formed at the upper part of the safety device.

The battery pack according to another embodiment is the same as the battery pack of the previous embodiment except that a heat discharge groove may be formed on a side wall of a resin layer. Accordingly, the same drawing reference numerals are used for the same elements across various figures and explanation about the same elements will be omitted. The resin layer different from the previous embodiment will be mainly explained below.

Again, the battery pack may include a battery pack 100, a circuit module 120, and a cover 130. In addition, the battery pack 100 may further include a label 140. The battery pack 100 may include a COB electrical element 122 in the circuit module 120. The battery pack 100 may include a resin layer 325 (FIG. 4) thick enough to contact the cell 110 on a surface of the circuit module 120.

Figure 4:
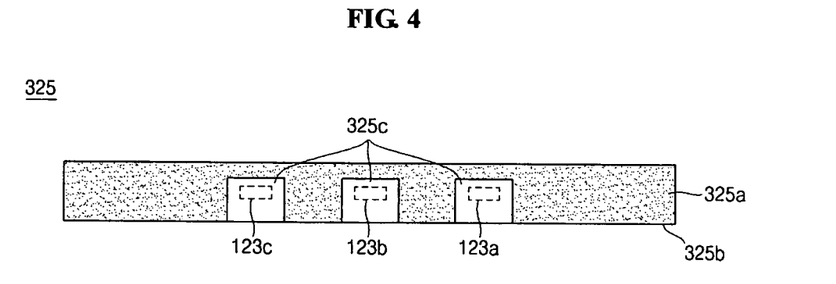
FIG. 4 illustrates a plan view of a shape of a resin layer according to an embodiment.

The resin layer 325 may contact a long side edge of the cell 110. The resin layer 325 may include a groove part 325a in contact with the cell 110 and a side wall part 325b extended from the groove part 325a. The groove part 325a may be concave and round. The side wall part 325b may cover the electrical element 122 and may be thick enough to prevent a short between the cell 110 and circuit module 120.

Referring to FIG. 4, a heat discharge groove 325c may be in the resin layer 325. The heat discharge groove 325c may be in the groove part 325a and side wall part 325b extended from the groove part 325a. The heat discharge groove 325c may extend inward from the side surface of the resin layer 325. The electrical element 122, e.g., the charge switching element 123a, discharge switching element 123b, and control circuit 123c, inside the resin layer 225 may be exposed to, the outside of the resin layer 325 through the heat discharge groove 325c. When the heat discharge groove 325c is formed in the resin layer 325, heat generated in the electrical element 122 may be efficiently discharged to the outside of the resin layer 325. This may be an added benefit over the heat dissipation of the other embodiment in which the heat discharge hole 225c (See FIG. 3) is formed only at the groove part 225a (See FIG. 3) in contact with the cell 110.

The battery pack according to yet another embodiment may be a vertical installation type battery pack and the same as the horizontal type battery pack of the above embodiment except for locations and detailed structures of elements. Accordingly, the same drawing reference numerals are used for the same elements across various figures and explanation about the same elements will be omitted. A circuit module 120 of the vertical installation type battery pack different from the above embodiment will be mainly explained below.

Figure 5:
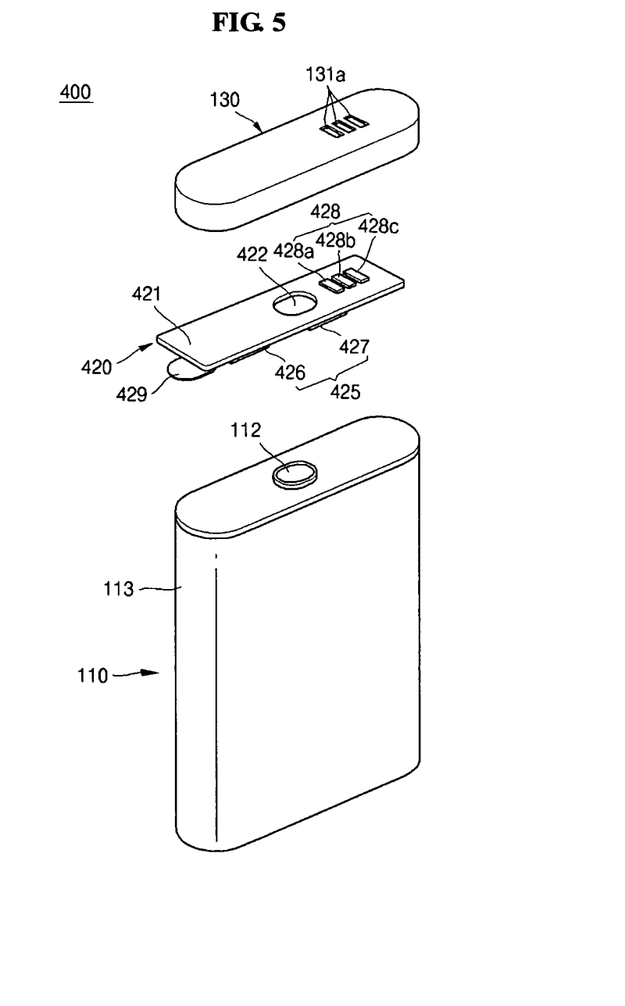
FIG. 5 illustrates an exploded perspective view of a shape of a battery pack according to an embodiment.
Figure 6A:
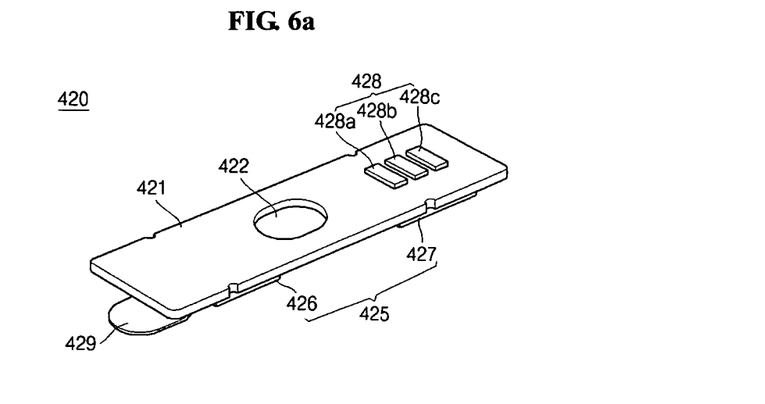
FIGS. 6a and 6b illustrate perspective plan and back views of structures of upper and lower parts of the protection circuit module according to an embodiment.
Figure 6B:
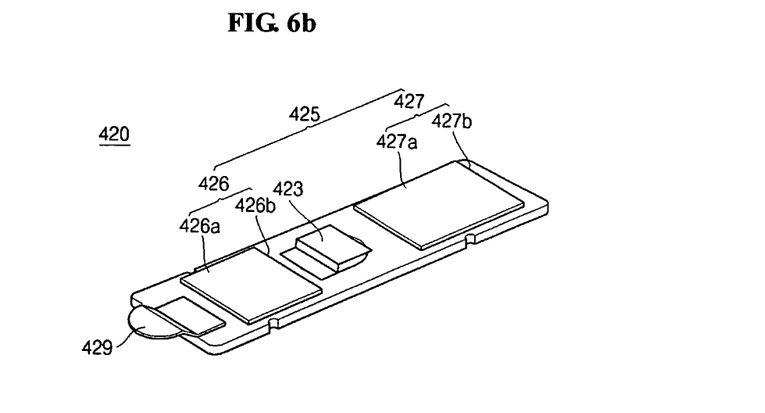

Referring to FIG. 5 and FIGS. 6a and 6b, the battery pack 400 according to an embodiment may be a vertical installation battery pack. The battery pack 400 may include a battery pack 100, a circuit module 420, and a cover 130.

The circuit module 420 may include a welding hole 422 and a resin layer 425. The welding hole 422 may provide a path for resistance welding. A resistance welding rod may be moved down through the welding hole 422 to weld an anode 112 of the cell 110 under the welding hole 422 and a conduction plate 423 electrically coupled to a secondary protection device (not shown). A cathode 111 of the cell 110 may be connected to a positive electrode (+) of the circuit module 420 through a lead tab 429 at one end of the circuit module 420.

The resin layer 425 may be in contact with a short side edge of the cell 110. The resin layer 425 may include first and second resin layers 426 and 427. The resin layer 425 may be separated into the first and second resin layers 426 and 427 by the welding hole 422 at the middle thereof. The resin layer 425 may be the same height as the lead tab 429. It may be desirable that the resin layer 425 is formed of insulating material. The resin layer 425 may be, e.g., a molded article, formed by molding, e.g., epoxy or epoxy-containing synthetic resin. The resin layer 425 may be disposed on a surface of the circuit module 420 including the COB electrical element to connect the cell 110 to the circuit module 420 and maintain balance between them, i.e., to maintain the horizontal disposition of the circuit module 420 relative to an adjoining horizontally disposed end surface of the cell 110.

The first resin layer 426 may be on one end of the circuit module 420. The first resin layer 426 may be between the lead tab 429 and welding hole 422. The lead tab 429 may be electrically coupled to one end of the circuit module 420. The first resin layer 426 may include a first horizontal part 426a and a first side wall part 426b. The first horizontal part 426a may be a horizontal surface in contact with the upper surface of the cell 110. The first side wall part 426b may be a side wall extended perpendicularly from the first horizontal part 426a.

The second resin layer 427 may be at the other end of the circuit module 420. The second resin layer 427 may be disposed at the end opposite to the first resin layer 426, with the welding hole 422 interposed between them. The second resin layer 427 may include a second horizontal part 427*a* and a second side wall part 427*b*. The second horizontal part 427*a* may be a horizontal surface in contact with the upper surface of the cell 110. The second side wall part 427*b* may be a side wall extended perpendicularly from the second horizontal part 427*a*.

The resin layer 425 may include the first and second horizontal parts 426*a* and 427*a* having a horizontal surface corresponding to the shape of the cell 110 in contact thereto. The first and second horizontal parts 426*a* and 427*a* may keep balance between the cell 110 and circuit module 420, and to press them to each other more tightly.

In a conventional battery pack, a lead tab may be connected to one end of the circuit module to electrically couple the cell to the circuit module. In addition, a dummy tab may be formed at the other end of the circuit module in order to prevent a short, and keep balance between the cell and circuit module. However, according to an embodiment, the dummy tab formation process may be omitted by providing the first and second resin layers 426 and 427. Thus, the manufacturing process and structure of the battery pack 400 may be simplified and the manufacturing cost may be reduced.

As described above, according to an embodiment, it is possible to omit the dummy tab, similarly to the battery pack 100 of the above embodiment in which the case holder is omitted. Thus, the manufacturing process may be beneficially simplified and the manufacturing cost is advantageously reduced. In addition, according to an embodiment, there may be compact and slim vertical installation battery pack 400 with high space utilization.

As described above, the battery pack according to an embodiment may produce the following effects. First, the protection circuit module is slimmed to the more compact size. Second, the manufacturing process and structure of the battery pack are simplified. Third, the space utilization of the battery pack is improved. Fourth, the manufacturing cost of the battery pack is reduced.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A battery pack, comprising:
   a cell having a long side edge;
   a circuit module electrically coupled to the cell, the circuit module including an insulation substrate, an electrical element installed on a first surface of the insulation substrate, the electrical element being a chip on board (COB) electrical element, and at least one resin layer surrounding the electrical element, and overlying the long side edge of the cell; and
   a cover surrounding the circuit module and coupling the circuit module to the cell;
   wherein:
   the resin layer has a first side that faces the first surface of the insulation substrate and a second side, opposite the first side, that faces the cell; and
   the resin layer includes:
   a groove part in the second side of the resin layer, the groove part having a curved shape in a first direction extending from a first end to a second end of the resin layer, the first direction parallel to the long side edge of the cell, the groove part having a varying thickness in a second direction crossing the first direction, such that the groove part conforms to a curved shape of the long side edge of the cell,
   a side wall part extending from the groove part towards the insulation substrate, and
   a heat discharge hole in the groove part that discharges heat from the electrical element to outside the resin layer.

2. The battery pack as claimed in claim 1, wherein the heat discharge hole is in communication with at least one of i) an active element including at least one of a charge switching element, a discharge switching element, and a control circuit, ii) a thermistor, and iii) a PTC element.

3. The battery pack as claimed in claim 1, wherein the resin layer includes at least one heat discharge aperture extending inwardly from the side wall part, such that the heat discharge aperture discharges heat from the electrical element to outside the resin layer.

4. The battery pack as claimed in claim 1, wherein the side wall part covers the electrical element.

5. The battery pack as claimed in claim 1, wherein the cell has a short side edge and the resin layer overlies the short side edge of the cell.

6. The battery pack as claimed in claim 5, wherein the resin layer includes a horizontal part in contact with the short side edge of the cell, and a side wall part extending from the horizontal part towards the insulation substrate.

7. The battery pack as claimed in claim 1, wherein the resin layer includes an epoxy or epoxy-containing synthetic resin.

8. The battery pack as claimed in claim 7, wherein the resin layer is a molding of the epoxy or epoxy-containing synthetic resin.

9. The battery pack as claimed in claim 1, wherein the resin layer is between the cell and the circuit module.

10. The battery pack as claimed in claim 1, further including a lead tab electrically coupling the cell and the circuit module.

11. The battery pack as claimed in claim 10, wherein the lead tab is the same height as the resin layer.

12. The battery pack as claimed in claim 1, wherein the circuit module includes:
    a printed circuit pattern on the first surface of the insulation substrate,
    a conduction pad electrically coupled to the printed circuit pattern, and
    a charge/discharge terminal on a second surface of the insulation substrate, electrically coupled to the printed circuit pattern.

13. The battery pack as claimed in claim 12, wherein the charge/discharge terminal includes a cathode terminal, an anode terminal, and an auxiliary terminal between the cathode and anode terminals.

14. The battery pack as claimed in claim 1, wherein the heat discharge hole overlaps the electrical element.

15. The battery pack as claimed in claim 1, wherein the second side of the resin layer directly contacts the cell.

16. The battery pack as claimed in claim 1, wherein the electrical element is exposed to the outside of the resin layer through the heat discharge hole.

* * * * *